(12) United States Patent
Li et al.

(10) Patent No.: US 11,329,076 B2
(45) Date of Patent: May 10, 2022

(54) DISPLAY SUBSTRATE COMPENSATING ALIGNMENT OFFSET OF THIN FILM TRANSISTOR ELECTRODES FOR IMPROVING DISPLAY QUALITY, AND DISPLAY DEVICE THEREOF

(71) Applicants: Beijing BOE Optoelectronics Technology Co., Ltd., Beijing (CN); BOE Technology Group Co., Ltd., Beijing (CN)

(72) Inventors: Yangheng Li, Beijing (CN); Hong Liu, Beijing (CN); Huiying Li, Beijing (CN); Xue Tian, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/281,136

(22) Filed: Feb. 21, 2019

(65) Prior Publication Data
US 2019/0363117 A1 Nov. 28, 2019

(30) Foreign Application Priority Data

May 28, 2018 (CN) .......................... 201810522537.2

(51) Int. Cl.
*H01L 27/146* (2006.01)
*G01T 1/208* (2006.01)

(52) U.S. Cl.
CPC ........ *H01L 27/14603* (2013.01); *G01T 1/208* (2013.01); *H01L 27/14663* (2013.01)

(58) Field of Classification Search
CPC ......... H01L 27/14603; H01L 27/14663; H01L 27/3262; G02F 1/1362; G02F 1/13624; G02F 1/1368

See application file for complete search history.

(56) References Cited

U.S. PATENT DOCUMENTS

2014/0292732 A1* 10/2014 Niioka .............. G02F 1/134363
345/204

* cited by examiner

*Primary Examiner* — Steven M Christopher
(74) *Attorney, Agent, or Firm* — Westman, Champlin & Koehler, P.A.

(57) ABSTRACT

A display substrate includes a plurality of pixel units. Each of the plurality of pixel units is provided with a plurality of sub-pixels. Each of the plurality of sub-pixels is correspondingly provided with a thin film transistor TFT. At least two TFTs are symmetrical about a geometric center point of the pixel unit.

19 Claims, 4 Drawing Sheets

DISPLAY SUBSTRATE COMPENSATING ALIGNMENT OFFSET OF THIN FILM TRANSISTOR ELECTRODES FOR IMPROVING DISPLAY QUALITY, AND DISPLAY DEVICE THEREOF

CROSS-REFERENCE TO RELATED APPLICATION

The present application claims the priority of the Chinese patent application No. 201810522537.2 filed in China on May 28, 2018, a disclosure of which is incorporated herein by reference in its entirety.

TECHNICAL FIELD

The present disclosure relates to the field of display technology, and in particular, relates to a display substrate and a display device.

BACKGROUND

If some types of display devices, such as display screens and display panels, are applied to an industrial field, a user may observe an internal structure of an electronic component through the display devices. If the display devices are applied to a medical field, the user may observe internal lesions inside a body of a patient through the display devices. Performances of the display devices are directly related to many aspects in work and life of a person.

SUMMARY

The present disclosure provides a display substrate and a display device including the display substrate.

In the first aspect, the present disclosure provides a display substrate. The display substrate includes a plurality of pixel units, wherein each pixel unit of the plurality of pixel units is provided with a plurality of sub-pixels, each sub-pixel of the plurality of sub-pixels is provided with a thin film transistor TFT corresponding to the sub-pixel; at least two TFTs of the pixel unit are symmetrical about a geometric center point of the pixel unit.

Optionally, a quantity of the plurality of sub-pixels is four, the four sub-pixels are arranged as a matrix with two rows and two columns, a center point of a region formed by the four sub-pixels spliced together is coincident with the geometric center point of the pixel unit to which the four sub-pixels belong; two TFTs corresponding to two non-adjacent sub-pixels of the four sub-pixels and the geometric center point of the pixel unit are located on a same diagonal of the pixel unit to which the four sub-pixels belong.

Optionally, each of the at least two TFTs symmetrical about the geometric center point is arranged at a corner position of the pixel unit away from the geometric center point.

Optionally, a source electrode of each of the at least two TFTs symmetrical about the geometric center point is farther away from the geometric center point than a drain electrode corresponding to the source electrode.

Optionally, two TFTs corresponding to two adjacent sub-pixels of the four sub-pixels are symmetrical about a boundary line of the two adjacent sub-pixels, and the boundary line passes through the geometric center point.

Optionally, a quantity of the plurality of sub-pixels is eight, the eight sub-pixels are arranged as a matrix with two rows and four columns, or a matrix with four rows and two columns; a center point of a region formed by the eight sub-pixels spliced together is coincident with the geometric center point of the pixel unit to which the eight sub-pixels belong; each of the at least two TFTs symmetrical about the geometric center point is arranged at a corner position of the pixel unit away from the geometric center point.

Optionally, each of the plurality of pixel units is further provided with an alignment component; the alignment component includes a same film-layer structure as that of a TFT in each of the sub-pixels of the pixel unit; the alignment component is configured to show alignment states among films and layers of the TFT of each of the sub-pixels in the pixel unit.

Optionally, the alignment component includes a TFT configured to show the alignment states among the films and the layers of the TFT of each of the sub-pixels in the pixel unit to which the alignment component belongs; a structure of the TFT of the alignment component is a same as a structure of the TFT included in each of the sub-pixels in the pixel unit to which the alignment component belongs.

Optionally, the alignment component is arranged at the geometric center point of the pixel unit.

Optionally, at least one of a shape or a size of each of the plurality of sub-pixels is different from at least one of a shape or a size of another one of the plurality of sub-pixels.

Optionally, the shape of each of the plurality of sub-pixels is one of a rectangle, a square, a hexagon, a triangle, or an irregular polygon.

Optionally, a quantity of the plurality of sub-pixels is four; the four sub-pixels are arranged as a matrix with two rows and two columns; an intersection point of a connection line between two TFTs of two sub-pixels of the four sub-pixels arranged along a first diagonal direction and a connection line between two TFTs of two sub-pixels of the four sub-pixels arranged along a second diagonal direction is located in one of the four sub-pixels.

Optionally, a connecting line between a source electrode and a drain electrode of each of the at least two TFTs symmetrical about the geometric center point is parallel to a same edge of the pixel unit.

Optionally, the alignment component is arranged at a position surrounded by the plurality of sub-pixels included in the pixel unit to which the alignment component belongs.

In a second aspect, a display device including a display substrate according to the first aspect is provided in the present disclosure.

Optionally, the display device is a flat panel detector.

BRIEF DESCRIPTION OF THE DRAWINGS

The above described and additional aspects and advantages of the present disclosure will become apparent and readily understood from description of the embodiments made in combination with drawings below, wherein.

DETAILED DESCRIPTION

Figure 1:
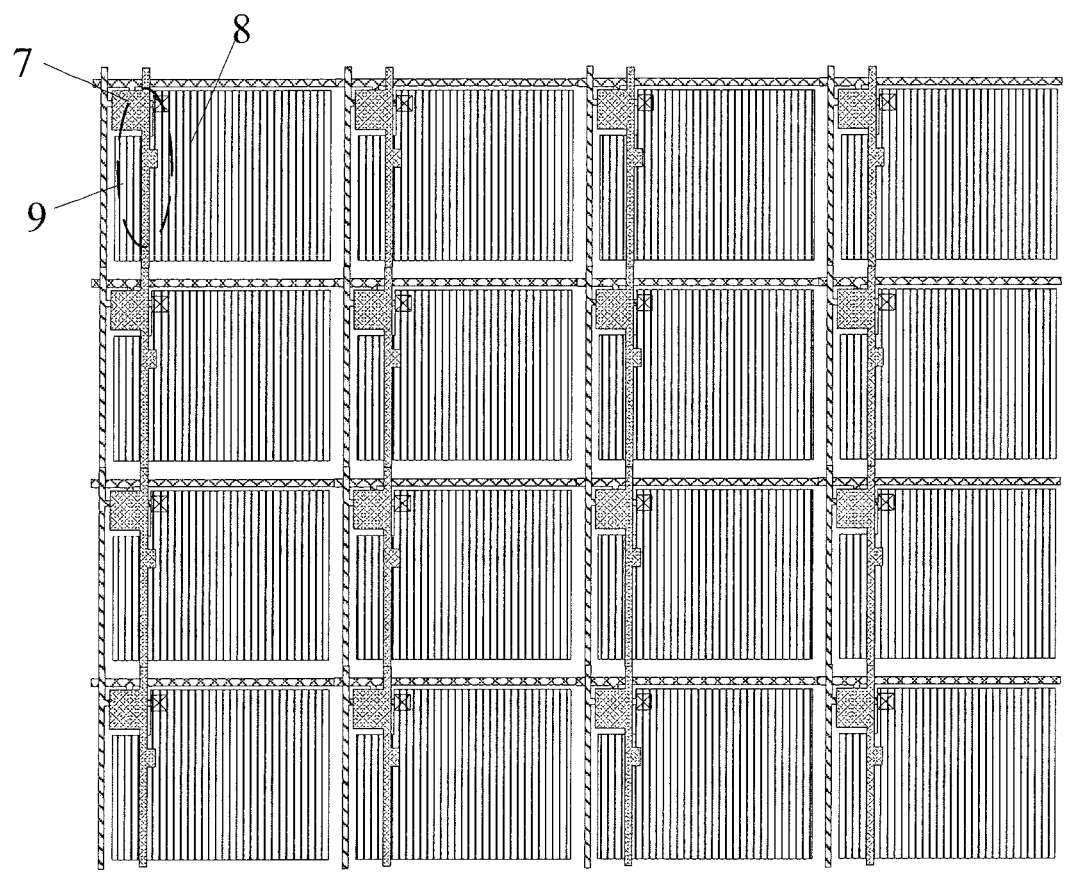
FIG. 1 is a schematic view of an arrangement of thin film transistors (TFTs) on a display substrate of a related display device.

FIG. 1 shows an arrangement of thin film transistors (TFTs) on a display substrate of a related display device. The display substrate shown in FIG. 1 may be a glass substrate. FIG. 1 shows a plurality of sub-pixels 8. Each of the plurality of sub-pixels 8 includes a TFT (Thin Film Transistor) 7 and a region 9 covering a metal protective layer over the TFT 7. In FIG. 1, the TFT 7 in the plurality of sub-pixels 8 are arranged at a same position in each of the sub-pixels 8. Specifically, the TFT 7 in each of the sub-pixels 8 is arranged at an upper left corner of the sub-pixel 8.

Figure 2:
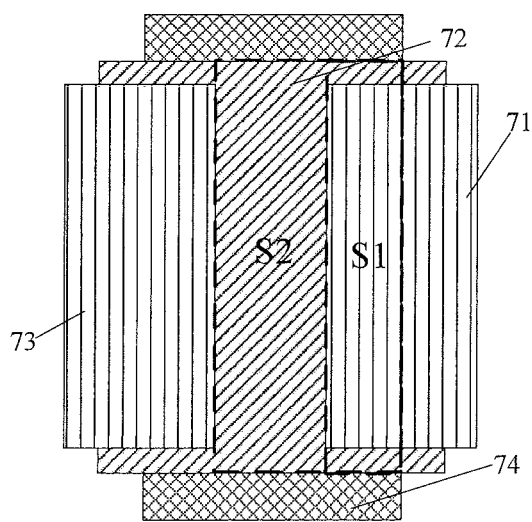
FIG. 2 is a structural schematic view of a film layer design of a related thin film transistor.

FIG. 2 is a structural schematic view of a film layer design of a related thin film transistor TFT. The TFT 7 of an effective display region (also referred to as an AA region) of the display substrate of a related indirect X-ray display device may adopt a structure of the film layer design of the TFT shown in FIG. 2. FIG. 2 shows a drain electrode 71 of the TFT 7, a semiconductor active layer 72 of the TFT 7, a source electrode 73 of the TFT 7, and a gate electrode 74 of the TFT 7. A parasitic capacitance Cgs between the source and drain electrodes and the gate electrode of the TFT 7 is proportional to (S1+S2/2). A dotted-line frame S1 indicates an effective area of the drain electrode of the TFT 7. A dotted-line frame S2 indicates an effective area of a channel region between the source electrode and the drain electrode of the TFT 7.

During an actual production process, some offsets may exist in alignments among layers of the TFT. In a case that the offset exists in the alignments among the source electrode, the drain electrode and the gate electrode, an area of the dotted-line frame S1 and/or an area of the dotted-line frame S2 may change and the parasitic capacitance Cgs also deviates. The parasitic capacitance Cgs is directly related to a feedthrough voltage (Feedthrough) coupled instantaneously at an instant when the gate electrode is turned off. The feedthrough voltage is recorded as ΔVp. This ΔVp may affect an accuracy of a display result of the display device. The offsets of the source electrode and the drain electrode relative to the gate electrode often occur in a large area and in multiple batches, or may also occur in a small region accidentally. The occurrence may affect the display result of the display device (such as gray scale abnormality), thereby affecting a quality of the display panel of the display device.

During the actual production process, for example, when the layers included in the TFT are subjected to exposure and alignment, a photolithography plate may also be offset. The offset of the photolithography plate may cause patterns of source electrodes or drain electrodes of a plurality of TFTs to be offset in a certain direction. Because the arrangement of the TFTs in the related display substrate is that positions of the plurality of TFTs relative to the sub-pixels to which the TFTs belong are the same (for example, the plurality of TFTs in FIG. 1 are uniformly located in the upper left corner of the sub-pixels corresponding to the TFTs). Thus, once the patterns of the drain electrodes of the plurality of TFTs in one display substrate are offset, the patterns of the drain electrodes are often offset in the same direction. In a case that the offsets occur, changes of the area S1 of the drain electrodes of the TFTs and changes of the area S2 of the channel regions between the source electrodes and the drain electrodes of the TFTs are the same, causing a relative large overall deviation of all Cgs of the TFTs and further causing large deviations of the Cgs of the TFTs and the ΔVp coupled instantaneously at the instant when the gate electrode is turned off, and finally causing a gray-scale deviation of an entirety of a large-area display region occupied by the sub-pixels corresponding to these TFTs (i.e., display abnoixnality).

Since an alignment deviation in the production process may not be avoided completely, the present disclosure improves the arrangement of the TFTs to reduce an overall variation of the area S1 of the drain electrodes of the plurality of TFTs and an overall variation of the area S2 of the channel regions between the source electrodes and the drain electrodes of the plurality of TFTs in one direction, and reduce the overall deviation of the all Cgs of these TFTs, thereby reducing the probability that a gray-scale abnormality occurs in a wide area.

Figure 3:
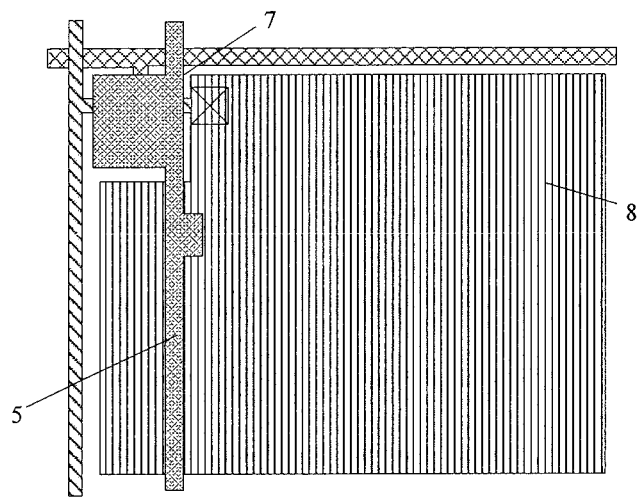
FIG. 3 is a partial enlarged view of a region circled by an elliptical dotted circle of FIG. 1.

FIG. 3 is a partial enlarged view of the region indicated by an elliptical dotted circle 9 of FIG. 1. FIG. 3 shows a related metal protective layer 5 and the TFT 7 covered by the metal protective layer 5.

The embodiments of the present disclosure are described in detail below with reference to FIG. 4-7. The examples of the embodiments are shown in the drawings. In the drawings, same or similar reference signs are used to represent same or similar elements or elements having same or similar functions. The embodiments described below with reference to the drawings are merely illustrative, and are not to be construed as limiting the scope of the present disclosure.

Figure 4:
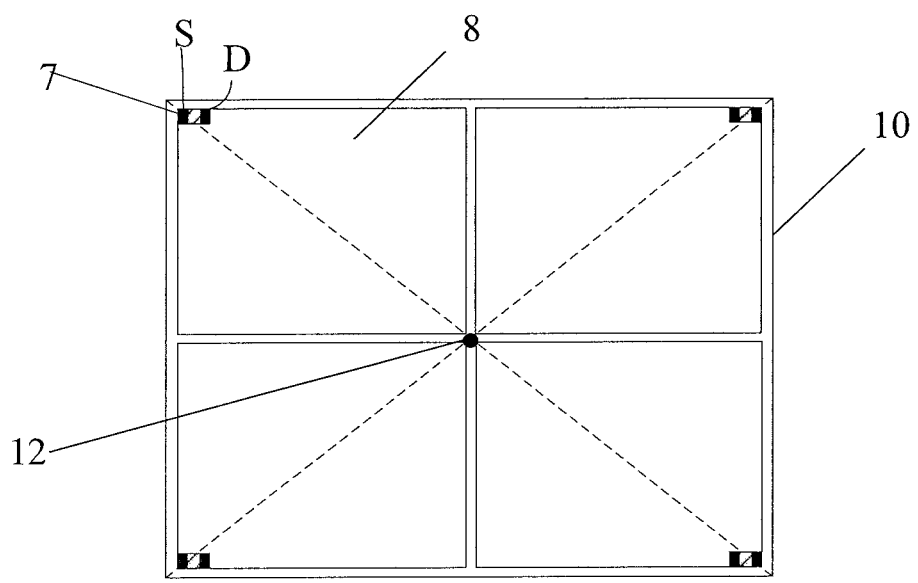
FIG. 4 is a schematic view of a pixel unit including four sub-pixels that are the same according to some embodiments of the present disclosure.

The present disclosure provides a display substrate. As shown in FIG. 4, the display substrate includes a plurality of pixel units arranged in a plurality of rows and columns. FIG. 4 merely shows one pixel unit 10. The structures of other pixel units 10 are similar to that of the pixel unit shown in FIG. 4 and thus will not be shown one by one in the present disclosure. Each of the pixel units 10 is provided with a plurality of sub-pixels 8. A quantity of the plurality of sub-pixels 8 may be predetermined. FIG. 4 shows four sub-pixels 8. Each of the sub-pixels 8 is provided with a Thin Film Transistor (TFT) 7 corresponding to the sub-pixel. In each of the pixel units 10, TFTs 7 in at least two of the plurality of sub-pixels 8 are symmetrical about a geometric center point 12 of the pixel unit 10.

In the display substrate provided by some embodiments of the present disclosure, the plurality of TFTs included in the plurality of pixel units are not provided at same positions in sub-pixels in which the plurality of TFTs are arranged. The TFTs in at least two of the sub-pixels in each of the pixel units are symmetrical about the geometric center point of the pixel unit. In the case that films and layers of one TFT are offset in a certain direction, films and layers of the other TFT symmetrical to the one TFT are offset in a direction opposite to the certain direction; in the case that a parasitic capacitance Cgs of one TFT is increased due to the films and layers of the one TFT being offset, a parasitic capacitance Cgs of the other TFT symmetrical to the one TFT may be reduced due to the films and layers of the other TFT being offset. Therefore, variations of the parasitic capacitances of the two TFTs symmetrical to each other may compensate for each other to a certain extent, thereby greatly reducing a variation of an entirety of parasitic capacitances of TFTs in the plurality of pixel units, so that the display substrate is integrally avoided from having large blackened areas or large whitish areas. Further, a display result is more uniform in visual, so that a problem that the display device is prone to large-area gray scale abnormality may be effectively solved.

Optionally, in the case that each of the pixel units is rectangular, each of the pixel units is provided with a determined even number of sub-pixels 8, and each of the sub-pixels 8 corresponds to one TFT, each of the sub-pixels 8 is generally rectangular. This normalized layout facilitates an orderly arrangement of the sub-pixels in the pixel units, thereby making the display substrate more suitable for mass production.

Optionally, in the case that the determined even number of the sub-pixels 8 is four, and the four sub-pixels 8 are arranged in a matrix with two rows and two columns, a center point of a region formed by the four sub-pixels spliced together coincides with a geometric center point of the pixel unit to which the four sub-pixels belong.

A pixel unit including same four sub-pixels in some embodiments of the present disclosure is described below in accordance with a schematic view of FIG. 4.

As shown in FIG. 4, a pixel unit 10 of FIG. 4 includes four rectangular sub-pixels 8 having a same size, and each of the rectangular sub-pixels 8 includes one TFT 7. The four sub-pixels are arranged in a matrix with two rows and two columns, and are spliced together. A geometric center point 12 of the pixel unit 10 coincides with a center point of a region formed by the four sub-pixels 8 spliced together. A solid black dot in a center of FIG. 4 is the geometric center point 12 of the pixel unit 10. The geometric center point 12 is also the center point of the region formed by the four sub-pixels 8 spliced together. Two dotted lines are diagonals of the pixel unit 10.

Optionally, two TFTs corresponding to two of the four sub-pixels 8 which are not adjacent (i.e., diagonally arranged), and the geometric center point 12 are located on a same diagonal of the pixel unit 10 to which the four sub-pixels 8 belong. A small rectangular frame on a diagonal of the pixel unit 10 in FIG. 4 represents a TFT, wherein two black solid rectangular frames represent a source electrode S and a drain electrode D.

Optionally, in the two TFTs symmetrical about the geometric center point, a first connection line between a source electrode of one of the two TFTs and a drain electrode corresponding to the source electrode and a second connection line between a source electrode of the other of the two TFTs and a drain electrode corresponding to the source electrode are parallel to each other, and are parallel to a same edge of the pixel unit, as shown in FIG. 4.

As shown in FIG. 4 of the present disclosure, in order to avoid the display substrate from having large blackened areas or large whitish areas macroscopically, all TFTs included in the pixel unit in some embodiments of the present disclosure are arranged symmetrically about the geometric center point of the pixel unit. This arrangement provides a predetermined number of sub-pixels and the geometric center point in the pixel unit, such that TFTs corresponding to all sub-pixels in the pixel unit are symmetrical about the geometric center point. The variation of the parasitic capacitance of each of the TFTs in the pixel unit when films and layers of the TFT may is offset may be correspondingly compensated, thereby further avoiding the display substrate from having large blackened areas or large whitish areas macroscopically. Thus, the display result is also more uniform in visual.

Optionally, the TFTs are arranged at corner positions of the pixel unit away from the geometric center point.

In the case that the TFTs are arranged at the corner positions, a compensation effect of the variations of the parasitic capacitances of the TFTs is better, so that a compensation effect of gray scales is better.

Optionally, two of the four TFTs corresponding to two sub-pixels adjacent in a horizontal direction or a vertical direction are symmetrical about a boundary line of the two adjacent sub-pixels. The boundary line passes through the geometric center point. By setting a positional relationship of two adjacent sub-pixels, the display substrate according to some embodiments of the present disclosure further achieves a better compensation effect of the gray scales.

Figure 5:
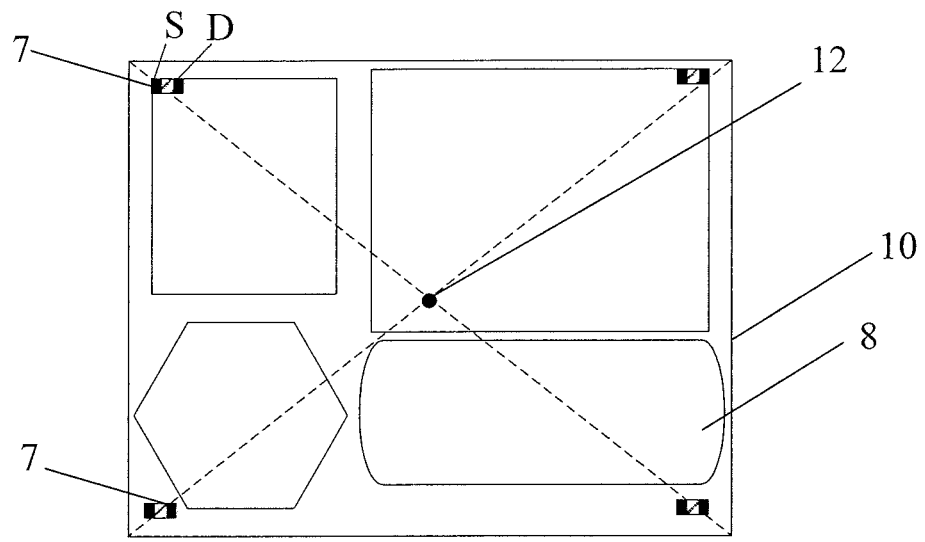
FIG. 5 is a schematic view of a pixel unit including four sub-pixels that are not exactly the same according to some embodiments of the present disclosure.

FIG. 5 is a schematic diagram showing a pixel unit 10 having four sub-pixels that are not totally identical in some embodiments of the present disclosure.

Possible cases of the four sub-pixels that are not totally identical may include one or more of the following.

1. The sub-pixels have a same shape, but have different sizes. 2. The sub-pixels have different shapes, but have a same size. 3. The sub-pixels have different shapes and different sizes.

Shapes of the subpixels may be various, such as rectangles, squares, hexagons, triangles, or irregular polygons, etc.

FIG. 5 shows that the pixel unit 10 includes four sub-pixels 8, wherein shapes of the four sub-pixels 8 are different and sizes of the four sub-pixels are different. The four sub-pixels include a first sub-pixel (a rectangular sub-pixel with a larger size, located in an upper right corner), a second sub-pixel (a rectangular sub-pixel with a smaller size, located in an upper left corner), a hexagonal sub-pixel (located in a lower left corner) and the quadrilateral subpixel with two curved edges (located in a lower right corner).

In FIG. 5, the geometric center point 12 of the pixel unit 10 including the four sub-pixels is located in the first sub-pixel with a larger size. Each of the sub-pixels is provided with one TFT correspondingly. Although a position of each TFT in the sub-pixel to which the TFT belong is not totally identical, Each TFT and another TFT belonging to a subpixel not adjacent to (i.e., diagonally arranged relative to) a subpixel to which the each TFT belongs are symmetrical about the geometric center point.

Optionally, in some embodiments of the present disclosure, in two TFTs symmetrical about the geometric center point, a source electrode of each of the two TFTs is farther away from the geometric center point than a drain electrode corresponding to the source electrode. Since the sub-pixel to which the TFT belongs is closer to the geometric center point than the TFT, the drain electrode in the TFT is closer to the geometric center point than the source electrode. Thus, the drain electrode of the TFT as an output terminal of the TFT is closer to the sub-pixel which functions as an object to which the drain electrode outputs. This arrangement facilitates simplification of wirings of the drain electrode of the TFT to the sub-pixel, and reduces wiring lengths and an occupied area. Obviously, this arrangement may facilitate manufacturing the TFT, and facilitate setting of leads of an entirety of a display panel and may occupy a relatively small area.

Optionally, in the two TFTs symmetrical about the geometric center point, a first connection line between a source electrode of one of the two TFTs and a drain electrode corresponding to the source electrode and a second connection line between a source electrode of the other of the two TFTs and a drain electrode corresponding to the source electrode are parallel to each other, and are parallel to a same edge of the pixel unit, as shown in FIG. 5.

Optionally, in some embodiments of the present disclosure, a metal protective layer covering a channel region of the TFT is also provided. Specifically, the metal protective layer covers the channel region between the source electrode and the drain electrode of the TFT. Optionally, the metal protective layer covers the channel region and the drain electrode of the TFT. In an example that the metal protective layer used for shielding light covers the drain electrode of the TFT, arrangement of the metal protective layer has a good shading effect and may effectively prevent the TFT in a working state from being affected by the light, and thus prevent the TFT from being turned on abnormally.

Although the arrangement of the metal protective layer may effectively prevent the TFT in the working state from being affected by the light and prevent the TFT from being turned on abnormally, the arrangement of the metal protective layer makes it impossible to directly observe overlapping and alignment conditions of the films and layers of the TFT under a microscope when a defective analysis is needed to be performed in an actual production process and a morphology of the TFT needs to be confirmed.

In the case that the defective analysis is needed in the actual production process and the morphology of the TFT needs to be confirmed, the metal protective layer needs to be scraped off manually. However, during manually scraping, it is difficult to ensure that the metal protective layer is scraped off accurately each time to expose the TFT and a degree of damaging the TFT may not be guaranteed to be within a controllable range. Therefore, the TFT may be scratched.

This manual operation may not ensure that the TFT is exposed during the operation and may not control the degree of damaging the TFT to be under a minimum level. In other word, the manual operation cannot peel off the metal protective layer accurately and precisely, and since measurement may only be performed to a region including a TFT covered by the metal protective layer region being scraped off so as to find the that may be measured and may be confirmed. Thus, this method is not only destructive but also less accurate. Obviously, this method may not avoid destructive measurement, and cannot guarantee an accuracy of the measurement.

In order to ensure more accurately and more easily confirmation of alignment states among the films and layers of a TFT in the display substrate provided by the present disclosure, the present disclosure further provides an alignment component and a specific arrangement of the alignment component such that some embodiments of the present disclosure are capable of performing the defective analysis and confirming morphology of a TFT without damaging metal protective layers for shading other TFTs.

Figure 6:
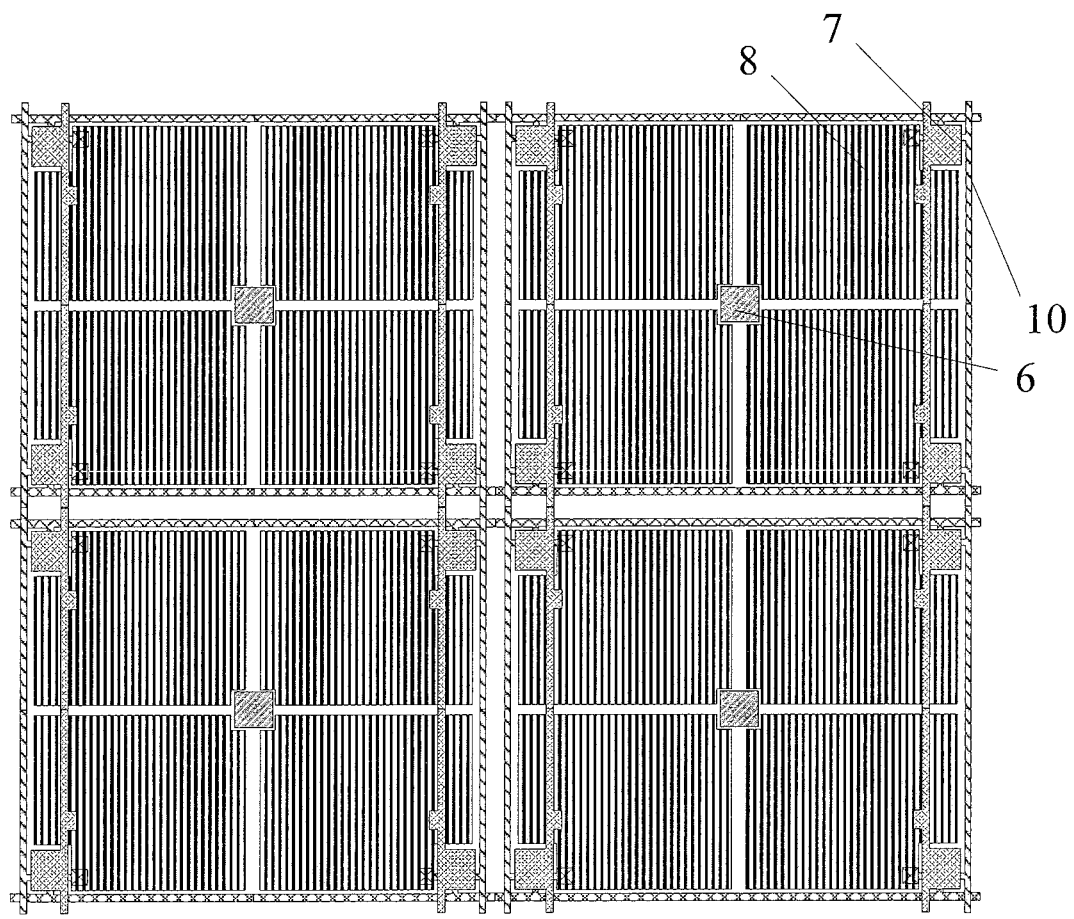
FIG. 6 is a schematic view of an arrangement of the TFTs on a display substrate of a display device according to some embodiments of the present disclosure.

As shown in FIG. 6, FIG. 6 shows four rectangular pixel units 10 on a glass panel of the present disclosure. Each of the pixel units 10 includes four rectangular sub-pixels 8.

Optionally, as shown in FIG. 6, the pixel unit 10 in some embodiments of the present disclosure is further provided with the alignment component 6. The alignment component 6 includes a same film-layer structure as the TFT corresponding to each of the sub-pixels in the pixel unit. The film-layer structure is used for showing the alignment states among the films and layers of each TFT in the pixel unit.

Optionally, the alignment component 6 includes a TFT for showing the alignment states among the films and layers of each TFT in the pixel unit to which the alignment component belongs. The TFT included in the alignment component 6 has a same structure as the TFTs included in the pixel unit to which the alignment component belongs.

According to the alignment component and the specific arrangement provided by some embodiments of the present disclosure, the display substrate of the present disclosure may show the alignment states among the films and layers of the TFT without damaging the metal protective layer for shading the TFT, so that technicians may perform the defective analysis and confirm the morphology of the TFT.

Optionally, as shown in FIG. 6, the alignment component 6 in some embodiments of the present disclosure is arranged at the geometric center point of the pixel unit 10.

Figure 8:
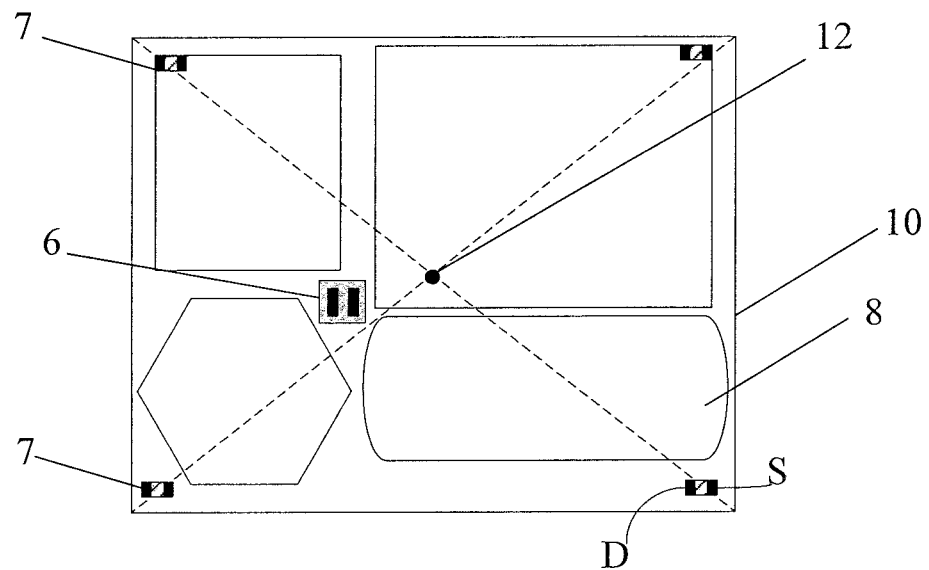
FIG. 8 is a schematic view of a position of an alignment component according to some embodiments of the present disclosure.

Optionally, as shown in FIG. 8, the alignment component 6 in some embodiments of the present disclosure is arranged at a position surrounded by the plurality of sub-pixels included in the pixel unit to which the alignment component 6 belongs. According to the above, in the case that the source electrode and the drain electrode of the TFT on a glass substrate are offset, the parasitic capacitance Cgs is deviated. The parasitic capacitance Cgs is directly related to a feed-through voltage coupled instantaneously at the time of a gate electrode being turned off. This feedthrough voltage is recorded as ΔVp. This ΔVp may affect an accuracy of a display result. During an actual production process, offsets of the source electrode and the drain electrode often appear in large areas and in batch, and sporadic abnormality in a small area may also exist probably. These offsets in large areas and the sporadic abnormality in a small area may affect the display result of a display device (such as gray-scale abnormality), thereby affecting a quality of a glass panel of the display device.

Figure 7:
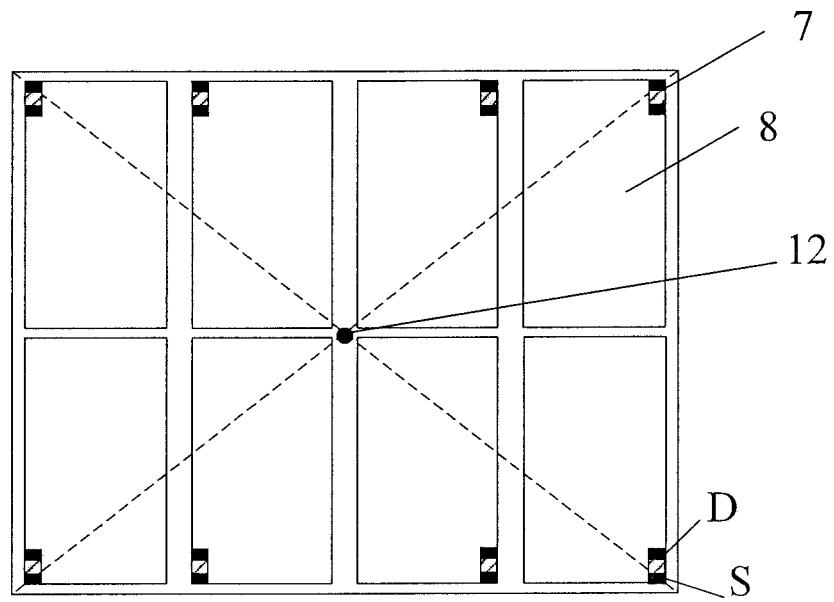
FIG. 7 is another schematic view of the arrangement of TFTs on the display substrate of the display device according to some embodiments of the present disclosure.

Optionally, in the case that the determined number of sub-pixels in each pixel unit is specifically eight and the eight sub-pixels are arranged in a matrix with two rows and four columns, or a matrix with four rows and two columns, a center point of a region formed by the eight sub-pixels spliced together coincides with the geometric center point of the pixel unit to which the eight sub-pixels belong, and the TFT of each sub-pixel is arranged at a corner position away from the geometric center point of the pixel unit. FIG. 7 is another schematic diagram of an arrangement of the TFTs on the display substrate of the display device according to some embodiments of the present disclosure.

The arrangement of the thin film transistors TFTs shown in FIG. 7 effectively solves the above-mentioned technical problems and defects of the abnormal display results. The pixel unit in FIG. 7 includes eight sub-pixels 8 arranged in the matrix with two rows and four columns, and the eight sub-pixels are arranged in a centrally symmetrical manner. Two intersecting dotted lines in FIG. 7 are diagonals of the pixel unit. An intersection point of the diagonals is a geometric center point 12 of the pixel unit to which the eight sub-pixels 8 belong, and is also a center point of the region formed by the eight sub-pixels spliced together. In the case that a slight offset in a large area occurs due to a process, the eight TFTs in FIG. 7 are offset in four directions about the geometric center (i.e., a top left direction, an upper right direction, a lower left direction, a lower right direction, respectively), thereby macroscopically avoiding large blackened areas or large whitish areas from occuring.

Based on a same inventive concept, some embodiments of the present disclosure also provide a display device. The display device includes the display substrate provided above by some embodiments of the present disclosure. The display substrate includes a plurality of pixel units. Each of the plurality of pixel units is provided with the plurality of sub-pixels. Each of the sub-pixels is provided with a TFT correspondingly. In each of the pixel units, at least two TFTs are symmetrical about a geometric center point of the pixel unit.

The display device may be used to a flat panel detector as a display component of the flat panel detector. When the display device is applied to the flat panel detector, the display device changes an arrangement design of TFTs on the glass panel of a related flat panel detector, thereby avoiding a case in which interferences of large-area detection results are caused by alignment offset among the films and layers of the TFTs in actual productions. At a same time, the alignment component for measuring alignment states among the films and layers of the TFTs is added to facilitate the subsequent defective analysis. Therefore, a situation in a current defective analysis in which the metal protective layer covering a TFT needs to be destroyed for purpose of performing measurement is changed, an accuracy of the measurement is increased, costs of the measurement are reduced, and "non-invasive measurement" is truly achieved Some embodiments of the present disclosure provide the display substrate including the plurality of pixel units. Each of the plurality of pixel units is provided with the determined number of sub-pixels. Each of the sub-pixels is provided with a TFT correspondingly. In each of the pixel units, at least two TFTs are symmetric about the geometric center point of the pixel unit. Therefore, in each pixel unit of the plurality of pixel units of some embodiments of the present disclosure, at least two TFTs are symmetrical about the geometric center point of the pixel unit. In the case that the films and layers of one TFT are offset in a certain direction, the films and layers of the other TFT symmetrical to the one TFT are offset in a direction opposite to the certain direction; in the case that the parasitic capacitance Cgs of one TFT is increased due to the films and layers of the one TFT being offset, the parasitic capacitance Cgs of the other TFT symmetrical to the one TFT may be reduced due to the films and layers of the other TFT being offset. Therefore, the variations of the parasitic capacitances of the two TFTs symmetrical to each other may compensate to each other, thereby greatly reducing variations of parasitic capacitances of TFTs in an entirety of the pixel unit, so that the display substrate is macroscopically avoided from having large blackened areas or large whitish areas. At the same time, the display result is more uniform in visual, so that the problem that the display result of the display device appears the large-area gray-scale abnormality may be effectively solved. The display device is optimized and an accuracy of a display result is in a good condition.

Those skilled in the art should understand that singular forms "a", "one", "the" used herein also cover plural forms unless specifically stated otherwise. It should be understood that terms "include", "includes" and "including" in the description of the present disclosure mean presence of stated features, integers, steps, operations, elements and/or components, but do not exclude presence or addition of at least one another feature, integer, step, operation, element, component, and/or group thereof. It should be understood that an element may be directly connected or coupled to another element or there may be exist an intervening element when the element is referred to as being "connected" or "coupled" to the another element. In addition, 'connected' or 'coupled' used herein may include a wireless connection or a wireless coupling. A term "and/or" used herein includes all or any combination of one or more related features or units listed by the term.

Those skilled in the art should understand that all terms (including technical and scientific terms) used herein have same meaning as commonly understood by those skill in the art to which the present disclosure belongs, unless otherwise defined. It should also be understood that terms such as those defined by a general dictionary should be understood to have meanings consistent with meanings of a context in the related art, and those terms should not be interpreted in an idealized or an overformal meaning unless they are specifically defined in a way defined herein.

The above is merely a part of embodiments of the present disclosure. It should be noted that a number of modifications or refinements may be made by those skilled in the art without departing from principles of the present disclosure, and such modifications and refinements are also considered to be within the scope of the present disclosure.

What is claimed is:

1. A display substrate, comprising:
   a base substrate;
   a plurality of pixel units disposed on the base substrate;
   wherein each pixel unit of the plurality of pixel units includes a plurality of sub-pixels, each sub-pixel of the plurality of sub-pixels includes a thin film transistor TFT corresponding to the sub-pixel;
   at least two TFTs of the pixel unit are disposed in the pixel unit symmetrically about a geometric center point of the pixel unit,
   wherein each of the plurality of pixel units is further provided with an alignment component;
   the alignment component comprises a same film-layer structure as that of a TFT in each of the sub-pixels of the pixel unit;
   the alignment component is configured to show alignment states among films and layers of the TFT of each of the sub-pixels in the pixel unit.

2. The display substrate according to claim 1, wherein, a quantity of the plurality of sub-pixels is four, the four sub-pixels are arranged as a matrix with two rows and two columns, a center point of a region formed by the four sub-pixels spliced together is coincident with the geometric center point of the pixel unit to which the four sub-pixels belong;
   two TFTs corresponding to two non-adjacent sub-pixels of the four sub-pixels and the geometric center point of the pixel unit are located on a same diagonal of the pixel unit to which the four sub-pixels belong.

3. The display substrate according to claim 2, wherein, each of the at least two TFTs symmetrical about the geometric center point is arranged at a corner position of the pixel unit away from the geometric center point.

4. The display substrate according to claim 3, wherein a source electrode of each of the at least two TFTs symmetrical about the geometric center point is farther away from the geometric center point than a drain electrode corresponding to the source electrode.

5. The display substrate according to claim 2, wherein, two TFTs corresponding to two adjacent sub-pixels of the four sub-pixels are symmetrical about a boundary line of the two adjacent sub-pixels, and the boundary line passes through the geometric center point.

6. The display substrate according to claim 1, wherein a quantity of the plurality of sub-pixels is eight, the eight sub-pixels are arranged as a matrix with two rows and four columns, or a matrix with four rows and two columns;
   a center point of a region formed by the eight sub-pixels spliced together is coincident with the geometric center point of the pixel unit to which the eight sub-pixels belong;

each of the at least two TFTs symmetrical about the geometric center point is arranged at a corner position of the pixel unit away from the geometric center point.

7. The display substrate according to claim 1, wherein the alignment component comprises a TFT configured to show the alignment states among the films and the layers of the TFT of each of the sub-pixels in the pixel unit to which the alignment component belongs;

a structure of the TFT of the alignment component is the same as a structure of the TFT of each of the sub-pixels in the pixel unit to which the alignment component belongs.

8. The display substrate according to claim 1, wherein the alignment component is arranged at the geometric center point of the pixel unit.

9. The display substrate according to claim 1, wherein at least one of a shape or a size of each of the plurality of sub-pixels is different from at least one of a shape or a size of another one of the plurality of sub-pixels.

10. The display substrate according to claim 9, wherein the shape of each of the plurality of sub-pixels is one of a rectangle, a square, a hexagon, a triangle, or an irregular polygon.

11. The display substrate according to claim 9, wherein a quantity of the plurality of sub-pixels is four;

the four sub-pixels are arranged as a matrix with two rows and two columns;

an intersection point of a connection line between two TFTs of two sub-pixels of the four sub-pixels arranged along a first diagonal direction and a connection line between two TFTs of two sub-pixels of the four sub-pixels arranged along a second diagonal direction is located in one of the four sub-pixels.

12. The display substrate according to claim 9, wherein a source electrode of each of the at least two TFTs symmetrical about the geometric center point is farther away from the geometric center point than a drain electrode corresponding to the source electrode.

13. The display substrate according to claim 9, wherein a connecting line between a source electrode and a drain electrode of each of the at least two TFTs symmetrical about the geometric center point is parallel to a same edge of the pixel unit.

14. The display substrate according to claim 9, wherein each of the plurality of pixel units is further provided with an alignment component;

the alignment component comprises a same film-layer structure as that of the TFT in each of the sub-pixels of the pixel unit;

the alignment component is configured to show alignment states among films and layers of the TFT of each of the sub-pixels in the pixel unit.

15. The display substrate according to claim 14, wherein the alignment component comprises a TFT configured to show the alignment states among the films and the layers of the TFT of each of the sub-pixels in the pixel unit to which the alignment component belongs;

a structure of the TFT of the alignment component is the same as a structure of the TFT of each of the sub-pixels in the pixel unit to which the alignment component belongs.

16. The display substrate according to claim 14, wherein the alignment component is arranged at a position surrounded by the plurality of sub-pixels comprised in the pixel unit to which the alignment component belongs.

17. The display substrate according to claim 1, wherein, a connecting line between a source electrode and a drain electrode of each of the at least two TFTs symmetrical about the geometric center point is parallel to a same edge of the pixel unit.

18. A display device, comprising:
a display substrate according to claim 1.

19. The display device according to claim 18, wherein the display device is a flat panel detector.

* * * * *